United States Patent [19]
Finney et al.

[11] Patent Number: 5,845,072
[45] Date of Patent: Dec. 1, 1998

[54] METHOD AND APPARATUS FOR PARALLEL AND PIPELINING TRANSFERENCE OF DATA BETWEEN INTEGRATED CIRCUITS USING A COMMON MACRO INTERFACE

[75] Inventors: Damon W. Finney, San Jose; Wen-Jei Ho, Saratoga; Mark C. Johnson, San Jose; Donald J. Lang, Cupertino, all of Calif.

[73] Assignee: International Business Machines Corporation, Armonk, N.Y.

[21] Appl. No.: 850,284

[22] Filed: May 5, 1997

Related U.S. Application Data

[63] Continuation of Ser. No. 337,702, Nov. 10, 1994, abandoned.

[51] Int. Cl.$^6$ ................................................. G06F 13/00
[52] U.S. Cl. ........................ 395/200.38; 395/200.53; 395/200.6; 395/200.8; 370/466; 370/463; 370/359
[58] Field of Search ................ 395/200.38, 200.47, 395/200.48, 200.53, 200.54, 200.55, 200.06, 200.68, 200.8, 200.79; 370/466, 463, 359

[56] References Cited

U.S. PATENT DOCUMENTS

| | | | |
|---|---|---|---|
| 4,058,672 | 11/1977 | Crager et al. | 178/3 |
| 4,295,149 | 10/1981 | Balyoz et al. | 257/211 |
| 4,434,462 | 2/1984 | Guttag et al. | 364/200 |
| 4,450,519 | 5/1984 | Guttag et al. | 364/200 |
| 4,701,860 | 10/1987 | Mader | 364/490 |
| 4,855,905 | 8/1989 | Estrada et al. | 395/500 |
| 4,897,799 | 1/1990 | Le Gall et al. | 364/514 |
| 4,901,360 | 2/1990 | Shu et al. | 382/41 |
| 4,933,952 | 6/1990 | Albrieux et al. | 375/1 |
| 5,023,590 | 6/1991 | Johnson et al. | 340/146.2 |
| 5,204,841 | 4/1993 | Chappell et al. | 365/230.05 |
| 5,206,529 | 4/1993 | Mine | 257/202 |
| 5,239,542 | 8/1993 | Breidenstein et al. | 370/79 |
| 5,261,080 | 11/1993 | Khoyi et al. | 395/500 |
| 5,377,191 | 12/1994 | Farrell et al. | 370/94.1 |
| 5,378,904 | 1/1995 | Suzuki et al. | 257/208 |
| 5,420,916 | 5/1995 | Sekiguchi | 379/230 |
| 5,473,777 | 12/1995 | Moeller et al. | 395/700 |

OTHER PUBLICATIONS

J. T. Liu, "Generic Adapter Bus Interface State Machine", IBM Technical Disclosure Bulletin vol. 35 No. 1B, p. 452, Jun. 1992.

Patel et al, "Common Data Base Schema for Hierarchical Very Large–Scale Integration Design", IBM Technical Disclosure Bulletin vol. 31 No. 8, pp. 220–226, Jan. 1989.

*Primary Examiner*—Meng-Ai T. An
*Attorney, Agent, or Firm*—Merchant, Gould, Smith, Edell, Welter & Schmidt, P.A.

[57] ABSTRACT

A common macro interface between chips that have design features in common and communicate with each other. The common macro interface (CMI) uses VHDL (VHSIC Hardware Description Language) which is the industry standard hardware design language. A common protocol is provided to resolve communication problems and comprises four signals: request; acknowledge request; data acknowledge, and read/write. A freeway system within the interfaces facilitates parallel and pipelining processes and an arbiter (also called a scheduler) is placed in front of every slave resource to control the traffic independently and to avoid traffic collisions from locking the freeway. The freeway is unique for each integrated circuit. Accordingly, macros may be moved from chip to chip without requiring complete system modifications and the effort involved in designing macros common to several chips may be shared.

19 Claims, 6 Drawing Sheets

METHOD AND APPARATUS FOR PARALLEL AND PIPELINING TRANSFERENCE OF DATA BETWEEN INTEGRATED CIRCUITS USING A COMMON MACRO INTERFACE

This is a Continuation of application Ser. No. 08/337,702, filed Nov. 10, 1994, now abandoned.

BACKGROUND OF THE INVENTION

1. Field of the Invention.

This invention relates in general to components within a semiconductor chip, and more particularly, to a common macro interface having a common protocol to resolve communication problems between chips and a freeway system associated with the common macro interface to facilitate parallel and pipelining processes.

2. Description of Related Art.

Within each node in a network, there are chips that interface or adapt to I/O devices, cache, or to the system. In order to carryout these functions, an interface is required between the processor and the other devices. A macro is the logic within each of the chips which process information or data received from other chips and requests or instructions sent to other chips in the network.

There may be four or five chips in a particular network. For example, a network for a disk controller may include a system adapter (SA) which talks to a communication link (ESCON®, a registered trademark of I.B.M. Corporation), a link interface (LI) that talks to a disk drive, a memory interface (MI) which talks to DRAM, and a buffer interface (BI) which talks to cache. As stated above, each chip may contain several macros. A macro may be a master macro which make requests. Alternatively, a macro may be a slave macro which processes the request. Some macros are only slaves and some macros are only masters. However, some macros may act in a dual capacity by both making requests to and processing requests from other chips or macros in the network. Chips may have one or multiple ports. The ports of the chips are specifically defined by the macros. In prior systems, the macros in each chip are unique to each chip. Thus, in the previous designs, a specific enable would have to be sent to another chip instructing the desired chip to receive the request. Furthermore, the address information was directly associated with the logic carrying out the operation. Thus, the request was routed to another macro for performing the desired operation by referencing the specified address.

However, until the system design is finalized, modifications are always required. Modifications to the system require the system designers to modify certain macros. For example, if a macro was moved to a different chip, every macro addressing the moved macro would be affected.

It can therefore be seen that there is a need for a method of communication between chips where macro design efforts may be shared by other system designers.

It can also be seen then that there is a need for a common macro interface to enable macros to communicate via a common protocol over a freeway that facilitates parallel and pipelining processes between chips.

Finally, it can also be seen that there is also a need to use only one macro design for all macros, especially where a macro is required in more than one chip. However, the internal logic interface attached to the macro, called freeway, must have a common macro interface.

SUMMARY OF THE INVENTION

To overcome the limitations in the prior art described above, and to overcome other limitations that will become apparent upon reading and understanding the present specification, the present invention discloses a common macro interface between chips that have design features in common and communicate with each other. The common macro interface (CMI) uses VHDL (Very High Scale Integrated Circuit (VHSIC) Hardware Description Language) which is the industry standard hardware design language used to synthesize the logic built into the chips.

The present invention solves the above-described problems by providing a common protocol to resolve communication problems. There are four signals to implement requests and processing incoming requests: request; acknowledge request; data acknowledge, and read/write. Further, a freeway system within the interfaces facilitates parallel and pipelining processes. Finally, to avoid traffic collisions from locking, an arbiter (also called a scheduler) is placed in front of every slave resource to control the traffic independently.

A system in accordance with the principles of the present invention comprises a communication freeway disposed within each integrated circuit for providing parallel and pipelining processes and a common macro interface, disposed between the freeway and the macros within the integrated circuits, for providing a common communication protocol for requesting and acknowledging data and request transfers. The common macro interface uses VHSIC hardware design language. Further, the freeway is unique for each integrated circuit.

One aspect of the present invention is that macros may be moved from chip to chip without requiring complete system modifications.

Another aspect of the present invention is that the effort involved in designing macros common to several chips may be shared.

These and various other advantages and features of novelty which characterize the invention or point out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a common protocol to resolve communication problems between chips and a freeway system within the common macro interface to facilitate parallel and pipelining processes.

Figure 1:
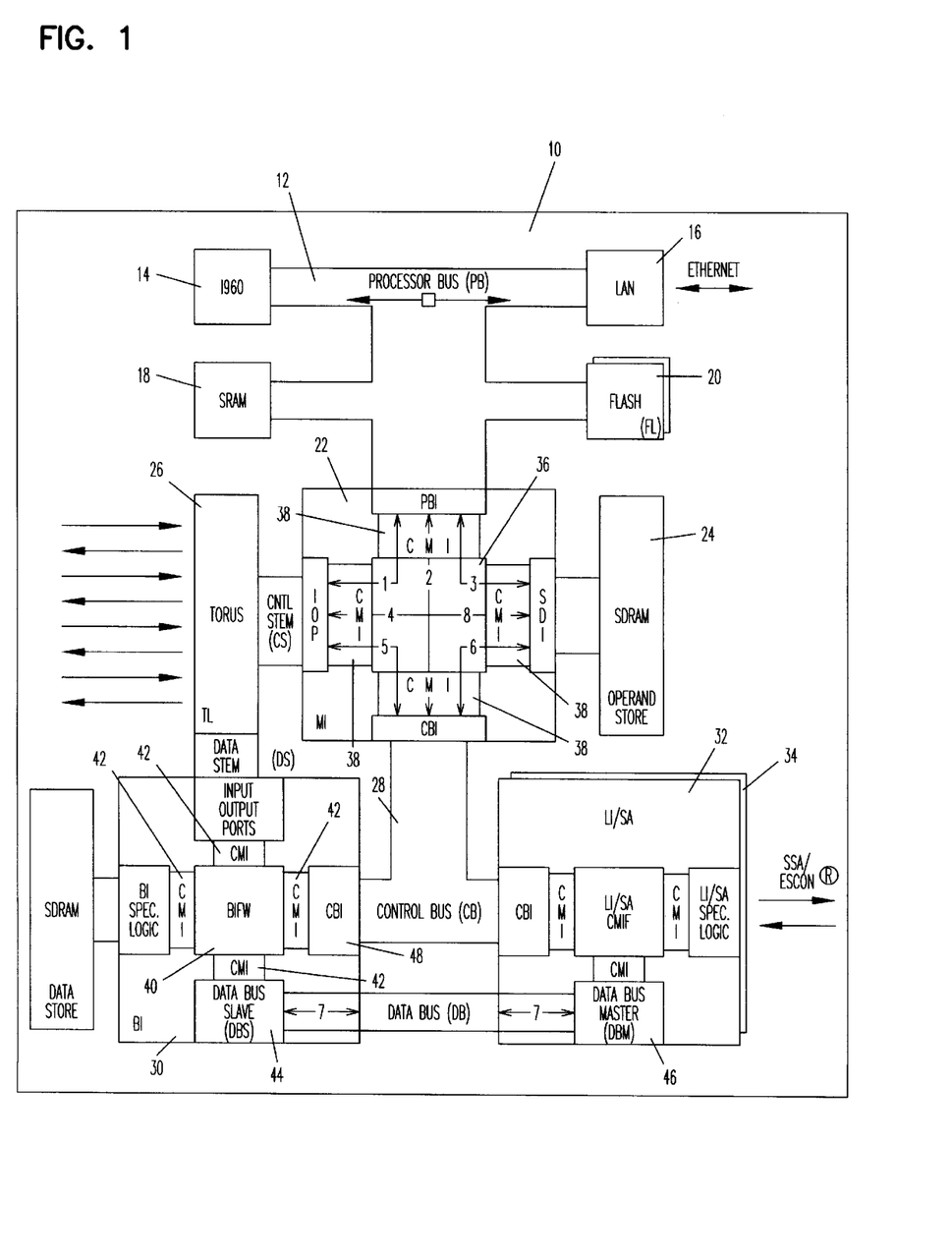
FIG. 1 is a block diagram of a system utilizing the communication interface according to the present invention.

FIG. 1 illustrates an exemplary system 10 utilizing the teaching of the present invention. The processor bus 12 links the processor 14 to a local area network 16, static RAM (SRAM) 18, initialization parameters from the flash 20 and the memory interface adapter 22. The memory interface adapter 22 is linked to the dynamic RAM (DRAM) 24 which stores the operands for the system, a multi-node network 26 (represented by the TORUS), and the control bus 28.

A buffer interface adapter 30 is attached to one end of the control bus 28 and interfaces with the TORUS 26. The TORUS 26 comprises a group of registers and facilitates parallel processing. A link interface adapter 32 and system adapter 34 is connected on the other end of the control bus 28. The SSA/ESCON® are communication links. For example, SSA may link the system to disk drives.

The memory interface freeway 36 resides in the memory interface adapter 22 and provides parallel pipelining of signals. The common macro interface 38 is used to link the unique freeway system for each chip to the macros. A similar arrangement is shown in the buffer interface 30, the link interface 32, and the system adapter 34.

The buffer interface chip 30 has a unique buffer interface freeway 40 which allows multiple access and pipeline processing of requests. Again, common macro interfaces 42 are used to link the macros with the buffer interface freeway 40. The buffer interface adapter 30 contains a data bus slave macro 44 which responds to requests from the data bus master macro 46 in the link interface 32 or system adapter 34 chip. Requests for macros external to the chip are routed to the control bus interface 48.

Figure 2:
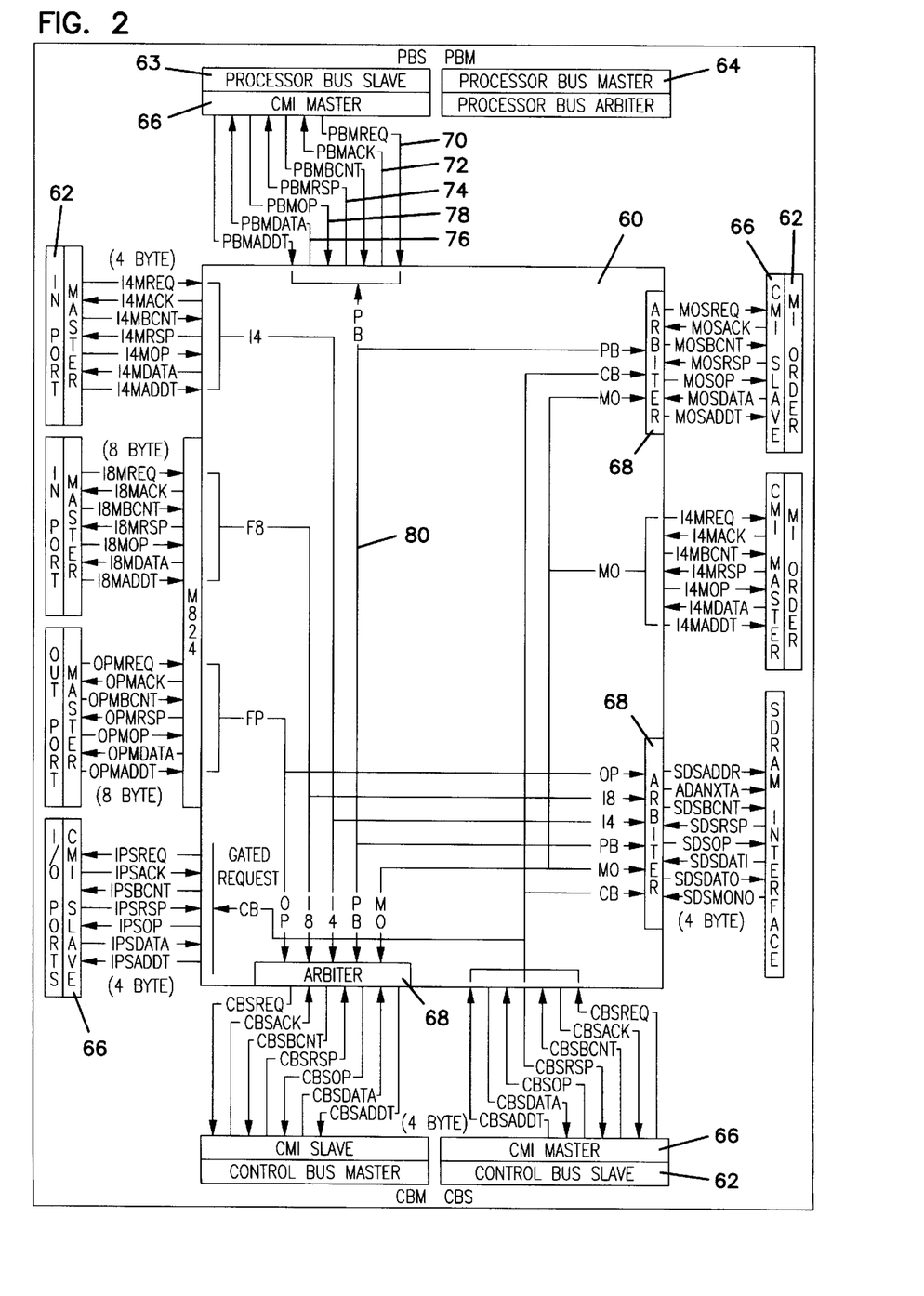
FIG. 2 is a block diagram of the memory interface freeway of FIG. 1 according to the present invention.

FIG. 2 illustrates a higher level block diagram of the memory interface adapter freeway 60. The various macros are positioned around the memory interface freeway 60, e.g. the processor bus, the control bus, and I/O ports. For example, the processor bus has slave 63 and master macros 64. Master macros 64 make requests while slave macros 63 service requests. A common macro interface 66 is interposed between the freeway 60 and the macros 62. If the macro 62 is a slave macro 66, an arbiter or scheduler 68 is positioned in front to prevent traffic collisions and the locking of the freeway.

Many of the macros are shared among the chips. In order to share the design effort and to prevent communication problems between the chips, a common protocol for the macros is used. To establish communication, a master wanting to talk will make a request, wait for acknowledgement and then either send data or wait for data depending on whether it is a read or write operation.

Accordingly, only four signals are required. The first signal is the request signal 70. The slave will acknowledge the request with a request acknowledgment signal 72. Then the slave will provide a data acknowledge signal 74. The data acknowledge signal 74 will mean that the slave got the data 76 if it was a write operation or that the data 76 is ready from the slave if it is a read operation. The fourth signal indicates whether the operation is a read or write operation 78. With this common interface protocol established, the memory interface internal switch 80 is built to allow parallel and pipelining data flow among the macros.

Figure 3:
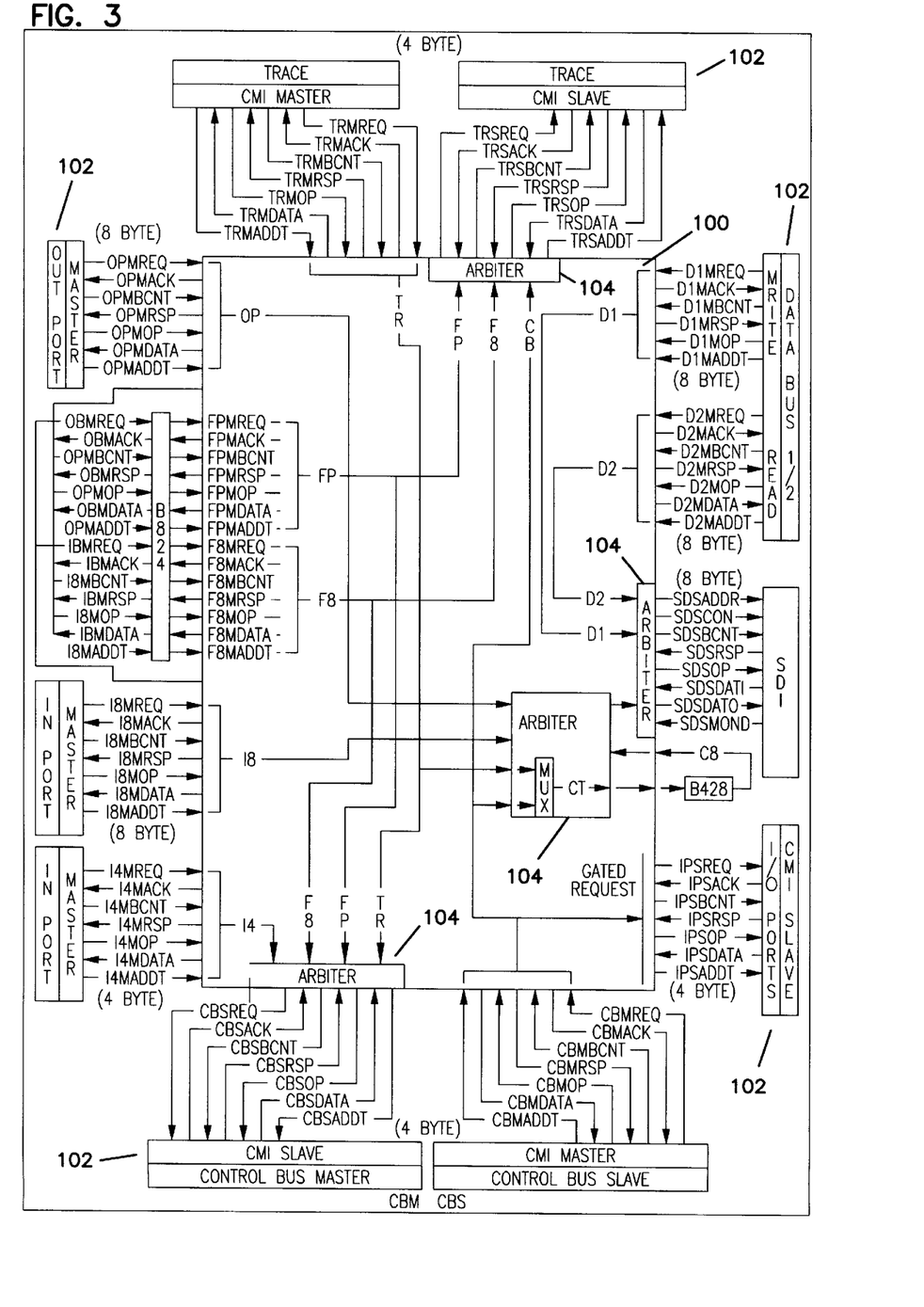
FIG. 3 is a block diagram of the buffer interface freeway of FIG. 1 according to the present invention.

FIG. 3 illustrates a high level block diagram of the buffer interface adapter 100 utilizing the teaching of the invention as disclosed above. The buffer interface adapter freeway 100 shown in the middle of the page facilitates parallel and pipelining data flows. Macros 102 are positioned around the buffer interface freeway 100 as discussed above with reference to FIG. 1. Again, an arbiter 104 is positioned in front of every resource slave to control the traffic independently. This allows parallel processing without causing traffic collisions.

Figure 4:
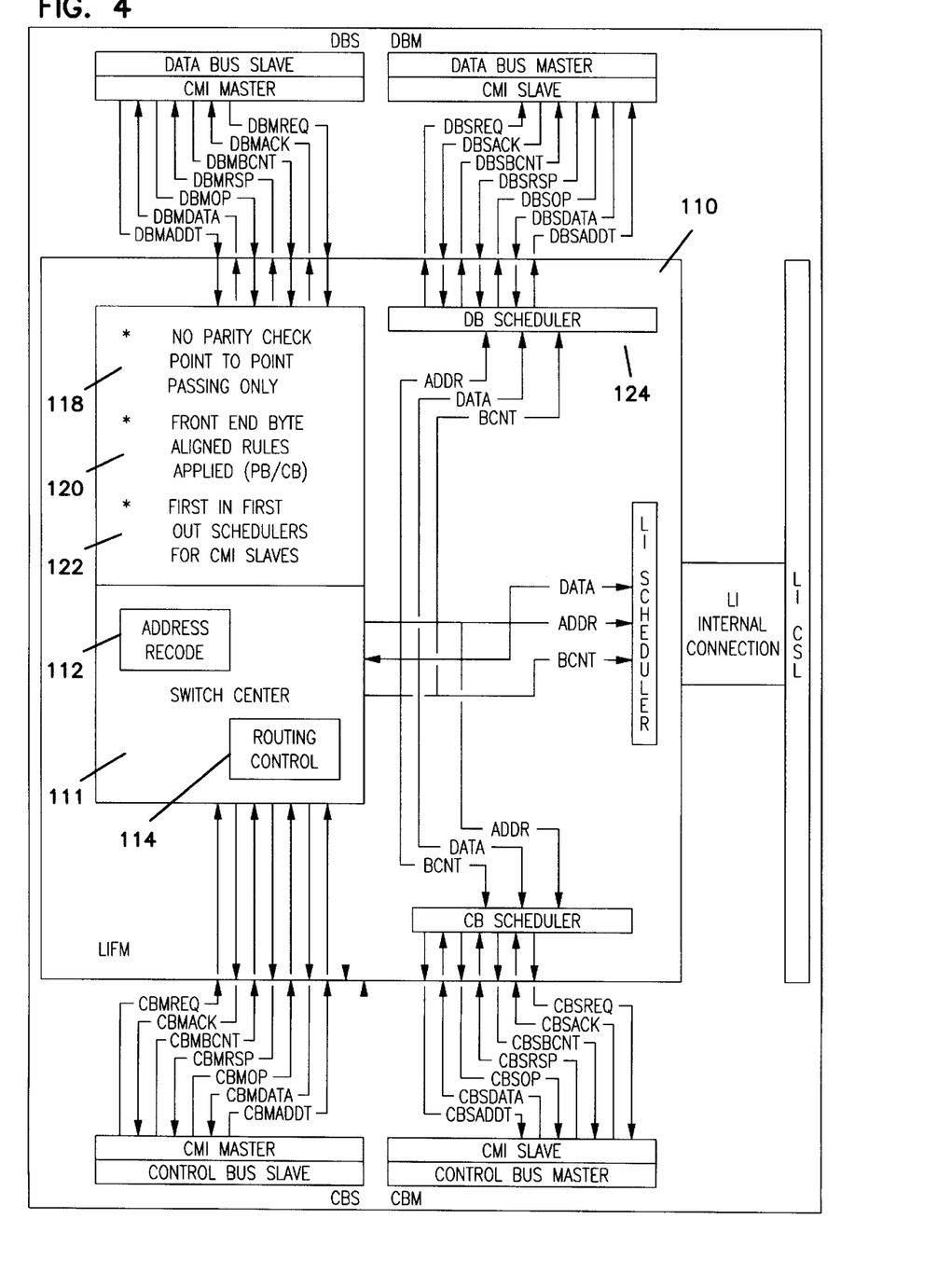
FIG. 4 is a block diagram of the link interface freeway of FIG. 1 according to the present invention.
Figure 5:
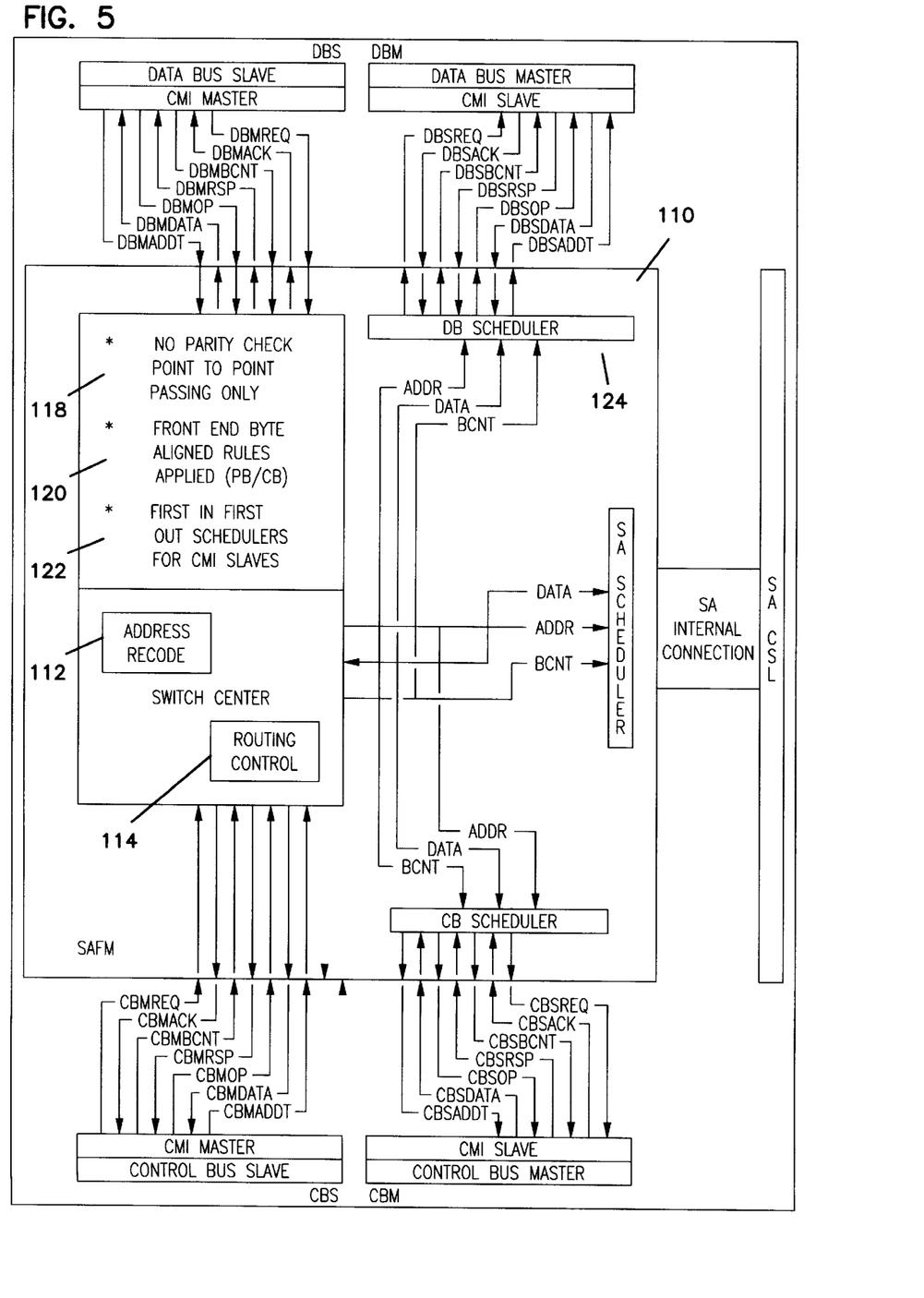
FIG. 5 is a block diagram of the system adapter freeway of FIG. 1 according to the present invention.

FIGS. 4 and 5 illustrate the common macros interface and the "freeway system" for the link interface adapter 110 and the system adapter 160. The switch center 111 decodes the address 112 and controls routing 114 of the signals within the freeway systems 110, 160. In the preferred embodiment there is no parity check 118. Rather point-to-point passing 118 is utilized. Front end byte line rules apply 120. Again, before each of the slaves you have first-in first-out schedulers or arbiters 122 to control routing of the signals.

Figure 6:
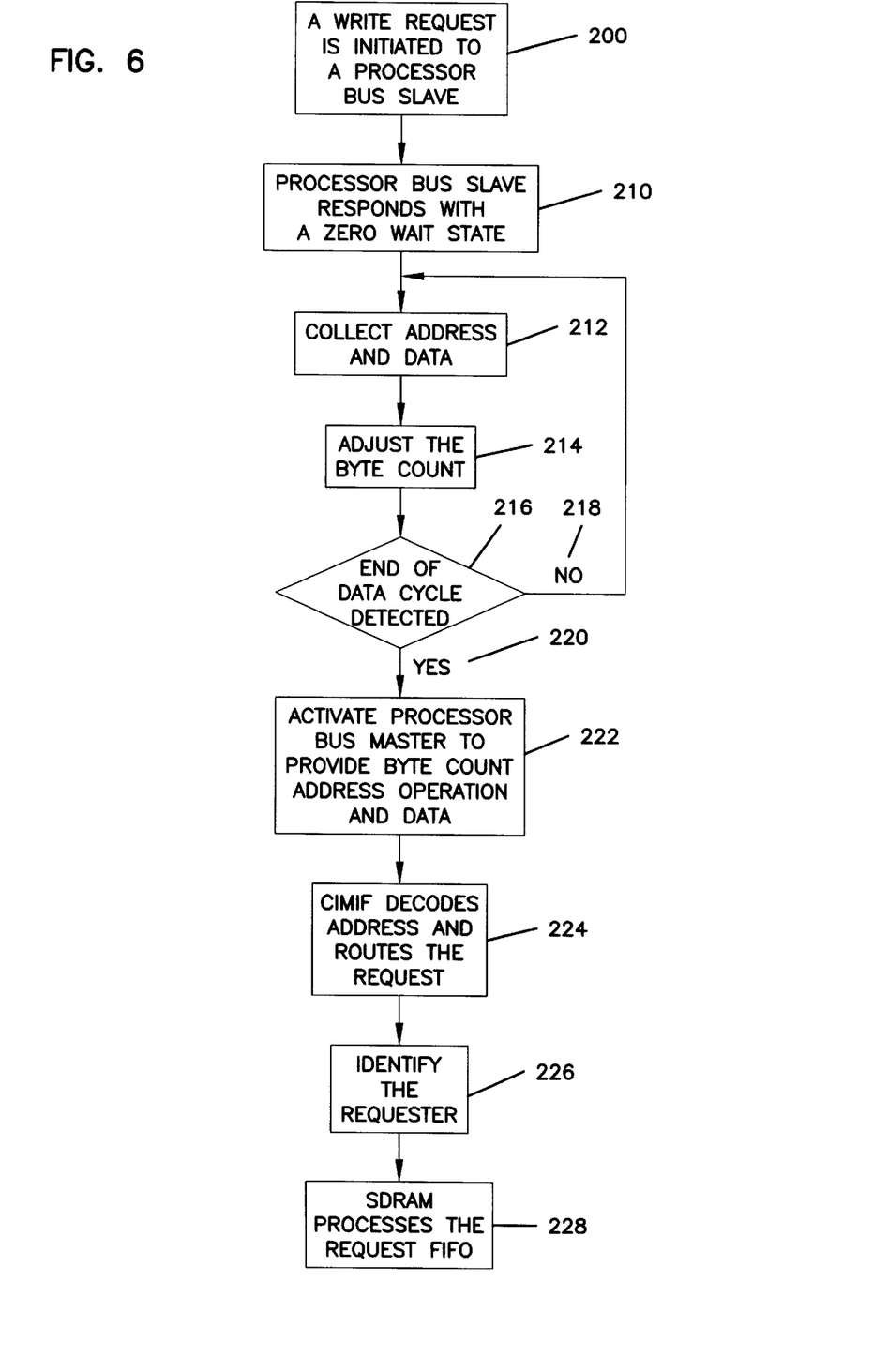
FIG. 6 is a flow chart of a write sequence from the processor to the DRAM of FIG. 1 according to the present invention.

Finally FIG. 6 illustrates a flow diagram of a processor write operation to the DRAM. Initially, a processor bus slave receives a write request 200. Then the processor bus slave responds ready with a zero wait state 210. This allows the address and data to be collected 212 and the byte count adjusted appropriately 214. Unless the end of the data cycle is indicated, the processor bus slave will respond ready with zero wait state again 218 and begin collecting more data 212 and updating the byte count 214. After the end of data cycle has been indicated 220 (signifying the end of the write access from the processor), the processor bus slave has the data and knows the address and final byte count for the write accessed at that time.

The processor bus slave will activate the processor bus master which provides the byte count, the address, the operation and the data to the common macro interface 222. The common macro interface then decodes the address and routes the request to the DRAM 224. The requestor is identified 226 and the DRAM scheduler processes the request first-in first-out 228.

In summary, different functions need to interface between the processor and their memory map. The ports from the macros are specifically defined. The macros can have one or multiple ports, but they all follow the common interface requirement. This allows each of the macros to be put in any chip desired.

A unique "freeway" is provided in each chip that enables the macro which requests access to some memory map facility to simply put the request and the address out on the freeway. The freeway analyzes the request and routes it to the right place. The macros don't know where the facilities they're trying to access are. Further, a master macro does not know who executed the request and doesn't care. Thus, each chip has a unique freeway based on which macros are actually implemented in that chip. The advantage is that the freeway can route requests directly and allows multiple accesses going in parallel from different masters to different slaves.

Finally, a common macro interface is placed between the freeway and macros within the chips for providing a common communication protocol for requesting and acknowledging data and request transfers.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A system for parallel and pipelining transference of data between a plurality of integrated circuits, each of the plurality of integrated circuits having at least one slave and master macro for generating and processing requests, the system comprising:

a unique communication network disposed within each of the integrated circuits for providing parallel and pipelining data transference between the slave and master macros; and a common protocol interface disposed within each of the integrated circuits for providing a common communication protocol, for requesting and acknowledging data and request transfers between the slave and master macros, each common protocol interface being disposed between the unique communication network and a respective one of the slave and master macros within the at least one of the integrated circuit.

2. The system of claim 1 further comprising an arbiter disposed between the common protocol interface and the slave macro of at least one of the integrated circuits to prevent traffic collisions and locking of the network.

3. The system of claim 1 wherein at least one of the common protocol interfaces uses very high speed integrated circuit (VHSIC) hardware design language.

4. The system of claim 1 wherein the common protocol interfaces and the unique communication networks cooperate to enable macro design to be shared among integrated circuit designers and to facilitate movement of macros from one integrated circuit to another integrated circuit without requiring complete system modifications.

5. The system of claim 1, wherein the common communication protocol comprises:

a first signal for initiating a request by one of the master macros to one of the slave macros;

a second signal provided by the one slave macro for acknowledging the request by the one master macro;

an operation signal provided by the one master macro for indicating whether the request is for sending data to the one slave macro or for obtaining data from the one slave macro; and a data acknowledgment signal for indicating that the one slave macro received the data sent by the one master macro when the operation signal indicates the request is for sending data to the one slave macro and for indicating that the one slave macro is ready to transmit the requested data to the one master macro when the operation signal indicates the request is for obtaining data.

6. The system of claim 5 further comprising an arbiter disposed in front of the one of the slave macros to prevent traffic collisions and locking of the network.

7. The system of claim 6 wherein at least one of the common network interfaces uses very high speed integrated circuit (VHSIC) hardware design language.

8. A high-end parallel disk control system, comprising:

a memory interface adapter coupled to and transferring data between a processor bus, an input/output port control register, dynamic memory, and a control bus;

a processor coupled to the processor bus;

a buffer interface adapter coupled to the control bus, and the input/output port control register;

a link interface adapter and a system adapter coupled to the control bus, the link interface adapter for communicating with a disk drive system and the system adapter coupled to a communication link;

a data bus disposed between the link interface adapter and the buffer interface adapter for facilitating the transference of data to and from the disk drive system; and the memory interface adapter, buffer interface adapter, link interface adapter and system adapter having slave and master macros for controlling and processing communications, the processing of communications being accomplished over a unique communication freeway disposed within each of the memory interface adapter, buffer interface adapter, link interface adapter and system adapter for providing parallel and pipelining processes, and a common macro interface providing a common communication protocol for requesting and acknowledging data and request transfers between the slave and master macros.

9. The disk control system of claim 8 wherein each of the common macro interface is disposed between its respective unique communication freeway and the slave and master macros.

10. The system of claim 8 further comprising an arbiter disposed between at least one of the common macro interfaces and at least one of the slave macros to prevent traffic collisions and locking of the freeway.

11. The system of claim 8 wherein at least one of the common macro interfaces uses very high speed integrated circuit (VHSIC) hardware design language.

12. The system of claim 8, wherein the common communication protocol comprises:

a first signal for initiating a request by one of the master macros to one of the slave macros;

a second signal provided by the one slave macro for acknowledging the request by the one master macro;

an operation signal provided by the one master macro for indicating whether the request is for sending data to the one slave macro or for obtaining data from the one slave macro; and a data acknowledgment signal for indicating that the one slave macro received the data sent by the one master macro when the operation signal indicates the request is for sending data to the one slave macro and for indicating that the one slave macro is ready to transmit the requested data to the one master macro when the operation signal indicates the request is for obtaining data.

13. The system of claim 12 further comprising an arbiter disposed in front of at least one of the slave macros to prevent traffic collisions and locking of the freeway.

14. The system of claim 13 wherein at least one of the common macro interfaces uses very high speed integrated circuit (VHSIC) hardware design language.

15. The system of claim 8 wherein the common macro interfaces and the unique communication freeways cooperate to facilitate sharing and movement of macros between two or more of the memory interface adapter, buffer interface adapter, link interface adapter, and system adapter without requiring complete system modifications.

16. A system for parallel and pipelining transference of data between a plurality of integrated circuits, each of the plurality of integrated circuits having one or more slave and master macros for generating and processing requests, the system comprising:

a unique communication network disposed within at least one of the integrated circuits for providing parallel and pipelining processes; and a common protocol interface disposed between the unique communication network and a respective one slave macro and a respective one master macro within the at least one of the integrated circuits, for providing a common communication protocol for requesting and acknowledging data and request transfers between the slave and master macros; and an arbiter disposed between the common macro interface and the respective one slave macro to prevent traffic collisions and locking of the network.

17. The system of claim 16 wherein the common communication protocol comprises a first signal for initiating a request by the respective one master macro to the respective one slave macro, a second signal provided by the respective one slave macro for acknowledging the request by the respective one master macro, an operation signal provided by the respective one master macro for indicating whether the request is for sending data to the slave or for obtaining data from the respective one slave macro, and a data acknowledgment signal for indicating that the respective one slave macro received the data sent by the respective one master macro when the operation signal indicates the request is for sending data to the respective one slave macro and for indicating that the respective one slave macro is ready to transmit the requested data to the respective one master macro when the operation signal indicates the request is for obtaining data.

18. The system of claim 17 wherein the common macro interface and the unique communication freeway cooperate to enable macro design to be shared among integrated circuit designers and to facilitate movement of macros from between integrated circuits without requiring complete system modifications.

19. A method for parallel and pipelining transference of data between a plurality of integrated circuits each having one or more master and slave macros for processing data, the method comprising the steps of:

providing a unique communication network within each of the integrated circuits;

sending a request to a desired one of the slave macros from a particular one of the master macros;

sending an address of the desired slave macro onto at least one of the communication networks;

designating whether the request was a read operation or a write operation;

routing the request to the address of the desired slave macro by one or more of the communication networks;

providing a request acknowledgment signal in response to the desired slave macro receiving the request from the particular master macro; and providing a data acknowledgment signal from the desired slave macro, the data acknowledgment signal indicating that the data is ready if the operation was a read operation or that the desired slave macro received the data if the operation was a write operation.

* * * * *